United States Patent
Yang

(10) Patent No.: US 10,034,365 B2
(45) Date of Patent: Jul. 24, 2018

(54) BOARD ANCHORING DEVICE AND ELECTRONIC DEVICE INCLUDING THE SAME

(71) Applicant: Samsung Electronics Co., Ltd., Gyeonggi-do (KR)

(72) Inventor: Yong-Hee Yang, Gyeonggi-do (KR)

(73) Assignee: Samsung Electronics Co., Ltd (KR)

(*) Notice: Subject to any disclaimer, the term of this patent is extended or adjusted under 35 U.S.C. 154(b) by 0 days.

(21) Appl. No.: 15/366,575

(22) Filed: Dec. 1, 2016

(65) Prior Publication Data

US 2017/0171960 A1   Jun. 15, 2017

(30) Foreign Application Priority Data

Dec. 10, 2015   (KR) ........................ 10-2015-0176021

(51) Int. Cl.
    *H05K 7/18*   (2006.01)
    *H05K 1/02*   (2006.01)
    *H05K 5/00*   (2006.01)

(52) U.S. Cl.
    CPC ......... *H05K 1/0215* (2013.01); *H05K 1/0216* (2013.01); *H05K 5/0017* (2013.01)

(58) Field of Classification Search
    CPC ... H05K 1/0215; H05K 1/0216; H05K 1/0017
    USPC ........................................................ 361/799
    See application file for complete search history.

(56) References Cited

U.S. PATENT DOCUMENTS

| | | | | |
|---|---|---|---|---|
| 5,750,936 A | * | 5/1998 | Wheatley | F16B 41/002 174/138 G |
| 7,357,645 B2 | * | 4/2008 | Jeong | H05K 7/142 439/66 |
| 7,661,965 B2 | * | 2/2010 | Miyoshi | H01R 4/64 439/92 |
| 7,819,674 B2 | * | 10/2010 | Miyoshi | H01R 4/64 439/92 |
| 7,839,658 B2 | * | 11/2010 | Kim | H05K 7/142 361/807 |
| 7,869,197 B2 | * | 1/2011 | Lee | H04N 5/64 349/58 |
| 8,199,528 B2 | * | 6/2012 | Tachikawa | H05K 7/142 174/350 |
| 9,370,091 B2 | * | 6/2016 | Kinoshita | H01R 12/55 |
| 9,507,380 B2 | * | 11/2016 | McKittrick | G06F 1/1656 |
| 2008/0025005 A1 | | 1/2008 | Yeh et al. | |
| 2012/0146863 A1 | * | 6/2012 | Kwon | H01Q 1/243 343/720 |
| 2015/0338082 A1 | | 11/2015 | Hu | |

* cited by examiner

FOREIGN PATENT DOCUMENTS

JP   9162518   6/1997

*Primary Examiner* — Hung S Bui
(74) *Attorney, Agent, or Firm* — The Farrell Law Firm, P.C.

(57) ABSTRACT

Disclosed is an electronic device having a housing including an inner space, a board including a first face and a second face opposite to the first face, the board being disposed such that the second face directly faces the inner space of the housing, at least one washer member mounted on the first face of the board and having at least a portion being soldered to a conductive exposure portion exposed to the first face of the board, a fastening member that anchors the board to the housing, and at least one electronic component disposed in the housing to directly face the first face of the board.

18 Claims, 9 Drawing Sheets

BOARD ANCHORING DEVICE AND ELECTRONIC DEVICE INCLUDING THE SAME

PRIORITY

This application claims priority under 35 U.S.C. § 119(a) to a Korean Patent Application which was filed in the Korean Intellectual Property Office on Dec. 10, 2015 and assigned Serial No. 10-2015-0176021, the contents of which are incorporated herein by reference.

BACKGROUND

1. Field of the Disclosure

The present disclosure relates generally to an electronic device, and more particularly, to a board anchoring device and the electronic device including the board anchoring device.

2. Description of the Related Art

An electronic device may include a plurality of electronic components for organically executing various functions, in which at least some of the electronic components may be electrically connected to each other. The electronic components may be mounted on a printed circuit board (PCB) and a PCB assembly, which is mounted with a plurality of electronic components, and may be disposed inside an electronic device.

There is a need in the art to enable anchoring of the board disposed inside the electronic device, in a manner that does not cause movement or damage of the board despite of long-term use or an external impact.

SUMMARY

The present disclosure has been made to address the above-mentioned problems and disadvantages, and to provide at least the advantages described below.

Accordingly, an aspect of the present disclosure is to provide an electronic device including a board that can maintain integrity and protect the components mounted thereon for an extended period of time, despite long-term consistent use.

According to another aspect of the present disclosure, it is possible to provide a board anchoring device configured to prevent a delamination phenomenon and cracking of the board due to an external impact and to provide an electronic device including the board anchoring device.

According to an aspect of embodiments of the present disclosure, an electronic device includes a housing including an inner space, a board including a first face and a second face, which is opposite to the first face, the board being disposed such that the second face directly faces the inner space of the housing, at least one washer member mounted on the first face of the board, at least a portion of the washer member being soldered to a conductive exposure portion that is exposed to the first face of the board, a fastening member that anchors the board to the housing through the washer member and the first and second faces of the board, and at least one electronic component disposed in the housing to directly face the first face of the board.

According to another aspect of embodiments of the present disclosure, an electronic device includes a housing including an inner space, a board including a first face and a second face, which is opposite to the first face, the board being disposed such that the second face directly faces the inner space of the housing, a conductive shield can mounted on of the second face of the board and blocking radio waves, at least one washer member mounted on the first face of the board, at least a portion of the washer member being soldered to a conductive exposure portion that is exposed to the first face of the board, a fastening member that anchors the board to the housing through the conductive washer member, the board, and the conductive shield can, and a display coupled to the housing to directly face the first face of the board.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF EMBODIMENTS OF THE DISCLOSURE

Figure 1:
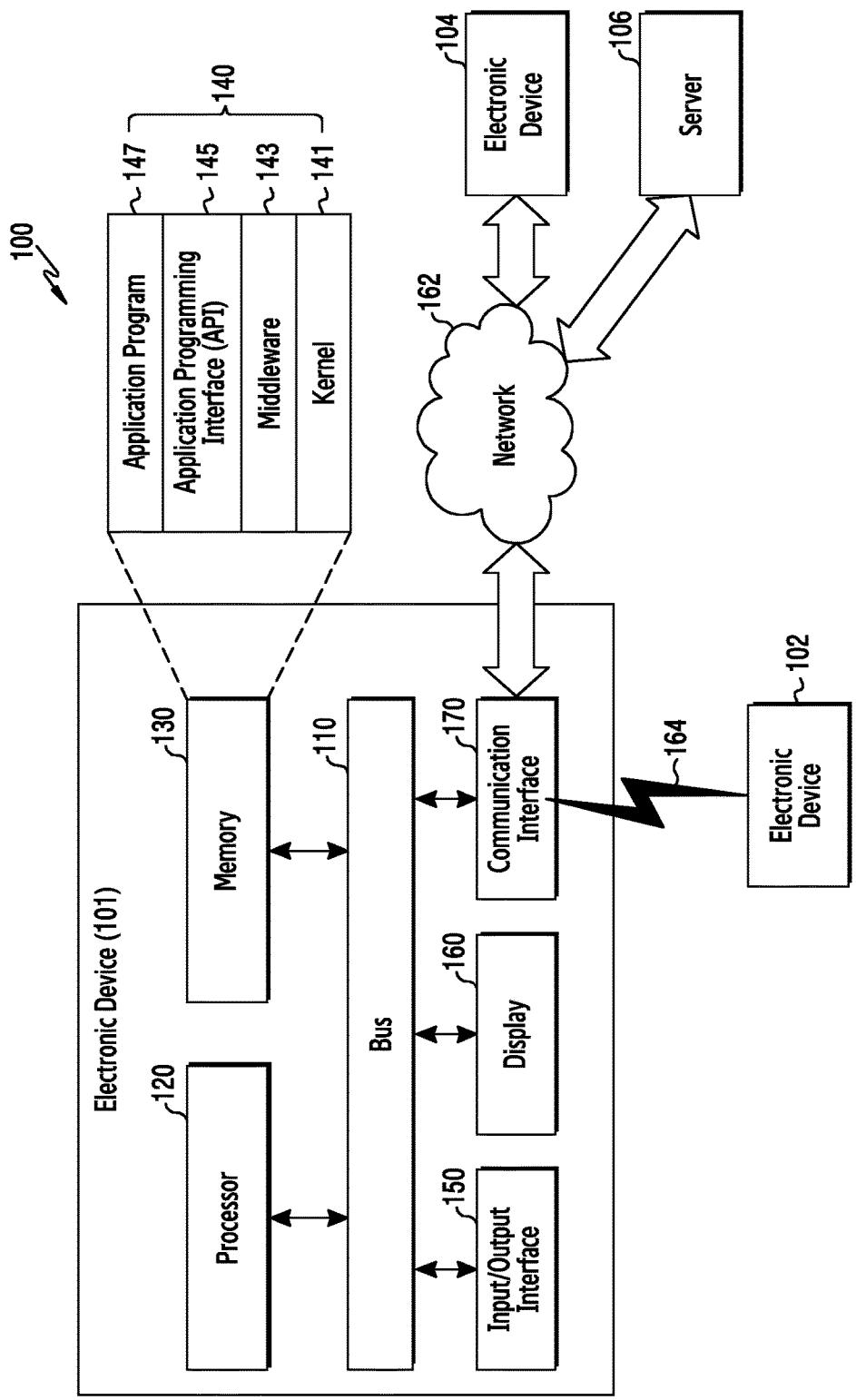
FIG. 1 illustrates a network environment that includes an electronic device according to embodiments of the present disclosure.

The following description with reference to the accompanying drawings is provided to assist in a comprehensive understanding of embodiments of the present disclosure. Those of ordinary skill in the art will recognize that various changes and modifications of the embodiments described herein can be made without departing from the scope and spirit of the present disclosure. In addition, descriptions of well-known functions and constructions may be omitted for the sake of clarity and conciseness.

The terms and words used in the following description and claims are not limited to their dictionary meanings, but are merely used to enable a clear and consistent understanding of the present disclosure. Accordingly, it should be apparent to those skilled in the art that the following description of embodiments of the present disclosure is provided for illustrative purposes only and not for the purpose of limiting the present disclosure as defined by the appended claims and their equivalents.

It is to be understood that the singular terms "a," "an," and "the" include plural references unless the context clearly dictates otherwise. Thus, for example, reference to "a component surface" includes reference to one or more of such surfaces.

The embodiments used to describe the principles of the present disclosure are by way of illustration only and should not be construed in any way to limit the scope of the disclosure. Those skilled in the art will understand that the principles of the present disclosure may be implemented in any suitably arranged electronic device.

By the term "substantially" it is meant that the recited characteristic, parameter, or value need not be achieved exactly, but that variations such as tolerances, measurement errors, measurement accuracy limitations and other factors known to those of skill in the art, may occur in amounts that do not preclude the effect the characteristic was intended to provide.

The terms "include" and "may include" used herein are intended to indicate the presence of a corresponding function, operation, or constitutional element disclosed herein, and are not intended to limit the presence of one or more functions, operations, or constitutional elements. In addition, the terms "include" and "have" are intended to indicate that characteristics, numbers, operations, constitutional elements, and elements disclosed in the specification or combinations thereof exist. However, additional possibilities of one or more other characteristics, numbers, operations, constitutional elements, elements or combinations thereof may exist.

As used herein, the expression "or" includes any and all combinations of words enumerated together. For example, "A or B" may include either A or B, or may include both A and B.

Although expressions used in embodiments of the present disclosure, such as "1st", "2nd", "first", "second" may be used to express various constituent elements of the embodiments of the present disclosure, these expressions are not intended to limit the corresponding constituent elements. The above expressions are not intended to limit an order or an importance of the corresponding constituent elements, and may be used to distinguish one constituent element from another constituent element. For example, a first user device and the second user device are both user devices, and indicate different user devices. Similarly, a first constituent element may be referred to as a second constituent element, and the second constituent element may be referred to as the first constituent element without departing from the scope of the present disclosure.

When an element is mentioned as being "connected" to or "accessing" another element, this may indicate that the element is directly connected to or accessing the other element, or there may be intervening elements present between the two elements. When an element is mentioned as being "directly connected" to or "directly accessing" another element, it is to be understood that there are no intervening elements present.

The term "module" as used herein may imply a unit including one of hardware, software, and firmware, or a combination thereof. The term "module" may be interchangeably used with terms, such as unit, logic, logical block, component, or circuit. A module as described herein may be a minimum unit of an integrally constituted component or may be a part thereof. The module may be a minimum unit for performing one or more functions or may be a part thereof. The module may be mechanically or electrically implemented. For example, the module as described herein includes at least one of an application-specific integrated circuit (ASIC) chip, field-programmable gate arrays (FPGAs), and a programmable-logic device, which are known or will be developed and which perform certain operations.

Unless otherwise defined, all terms, including technical and scientific terms, used herein have the same meaning as commonly understood by those of ordinary skill in the art to which embodiments of the present disclosure pertain. It will be further understood that terms, such as those defined in commonly used dictionaries, should be interpreted as having meanings that are consistent with their meaning in the context of the relevant art and the embodiments of the present disclosure, and should not be interpreted in an idealized or overly formal sense unless expressly so defined herein.

An electronic device as used herein may be include an antenna capable of performing a communication function in at least one frequency band, and may be a smart phone, a tablet personal computer (PC), a mobile phone, a video phone, an e-book reader, a desktop PC, a laptop PC, a netbook computer, a personal digital assistant (PDA), a portable multimedia player (PMP), a moving picture experts group phase 1 or phase 2 (MPEG-1 or MPEG-2) audio layer 3 (MP3) player, a mobile medical device, a camera, and a wearable device, such as a head-mounted-device (HMD) including electronic glasses, electronic clothes, an electronic bracelet, an electronic necklace, an electronic appcessory, an electronic tattoo, or a smart watch, for example.

The electronic device may be a smart home appliance having an antenna, such as a television (TV), a digital versatile disc (DVD) player, an audio player, a refrigerator, an air conditioner, a cleaner, an oven, a microwave oven, a washing machine, an air purifier, a set-top box, a TV box, such as Samsung HomeSync®, Apple TV®, or Google TV®, a game console, an electronic dictionary, an electronic key, a camcorder, and an electronic picture frame.

The electronic device including the antenna may be one of various medical devices, such as magnetic resonance angiography (MRA), magnetic resonance imaging (MRI), computed tomography (CT), imaging equipment, and an ultrasonic instrument, a navigation device, a global positioning system (GPS) receiver, an event data recorder (EDR), a flight data recorder (FDR), a car infotainment device, electronic equipment for a ship, such as a vessel navigation device, and a gyro compass, avionics, a security device, a car head unit, an industrial or domestic robot, an automated teller machine (ATM), and a point of sales (POS) device.

The electronic device may be part of at least one of an item of furniture or a building/structure including an antenna. The electronic device may be an electronic board, an electronic signature input device, a projector, or any of various measurement machines for such utilities as water supply, electricity, gas, and a propagation measurement machine.

The electronic device may be one or more combinations of the aforementioned various devices. In addition, the electronic device may be a flexible device. Moreover, the electronic device is not limited to the aforementioned devices.

Hereinafter, an electronic device according to embodiments of the present disclosure will be described with reference to the accompanying drawings. The term 'user' used in the embodiments may refer to a person who uses the electronic device or a device which uses the electronic device, such as an artificial intelligence (AI) electronic device.

FIG. 1 illustrates a view of a network environment including an electronic device according to an embodiment of the present disclosure.

Referring to FIG. 1, a network environment 100 includes an electronic device 101. The electronic device 101 includes a bus 110, a processor 120, a memory 130, an input/output interface 150, a display 160, and a communication interface 170. In embodiments of the present disclosure, the electronic device 101 can omit at least one of the components or further include another component.

The bus 110 includes a circuit for connecting the components and delivering communications such as a control message therebetween.

The processor 120 includes one or more of a central processing unit (CPU), an application processor (AP), and a communication processor (CP). The processor 120 processes an operation or data on control of and/or communication with another component of the electronic device 101.

The processor 120, which is connected to the long term evolution (LTE) network, determines whether a call is connected over the circuit switched (CS) service network using caller identification information, such as a caller phone number of the CS service network, such as the 2nd generation (2G) or 3rd generation (3G) network. For example, the processor 120 receives incoming call information, such as a CS notification message or a paging request message of the CS service network over the LTE network, such as circuit-switched fallback (CSFB). The processor 120 being connected to the LTE network receives incoming call information, such as a paging request message over the CS service network, such as single radio LTE (SRLTE).

When receiving the incoming CS notification message or a paging request message of the CS service network over the LTE network, the processor 120 obtains caller identification information from the incoming call information. The processor 120 displays the caller identification information on the display 160. The processor 120 determines whether to connect the call based on input information corresponding to the caller identification information displayed on the display 160. For example, when detecting input information corresponding to an incoming call rejection, through the input/output interface 150, the processor 120 restricts the voice call connection and maintains the LTE network connection. For example, when detecting input information corresponding to an incoming call acceptance, through the input/output interface 150, the processor 120 connects the voice call by connecting to the CS service network.

When receiving the incoming CS notification message or a paging request message of the CS service network over the LTE network, the processor 120 obtains caller identification information from the incoming call information. The processor 120 determines whether to connect the call by comparing the caller identification information with a reception control list. For example, when the caller identification information is included in a first reception control list, such as a blacklist, the processor 120 restricts the voice call connection and maintains the connection to the LTE network. When the caller identification information is not included in the blacklist, the processor 120 connects the voice call by connecting to the CS service network. When the caller identification information is included in a second reception control list, such as a white list, the processor 120 connects the voice call by connecting to the CS service network.

When receiving the incoming call information, such as a paging request message of the CS service network over the LTE network, the processor 120 sends an incoming call response message, such as a paging response message, to the CS service network. The processor 120 suspends the LTE service and receives the caller identification information, such as a circuit-switched call (CC) setup message, from the CS service network. The processor 120 determines whether to connect the call by comparing the caller identification information with the reception control list. For example, when the caller identification information is included in the blacklist, the processor 120 restricts the voice call connection and resumes the LTE network connection. When the caller identification information is not included in the he blacklist, the processor 120 connects the voice call by connecting to the CS service network. For example, when the caller identification information is included in the white list, the processor 120 connects the voice call by connecting to the CS service network.

The memory 130 can include volatile and/or nonvolatile memory. The memory 130 stores commands or data, such as the reception control list relating to at least another component of the electronic device 101. The memory 130 may store software and/or a program 140. The program 140 may include a kernel 141, middleware 143, an application programming interface (API) 145, and/or application programs (or applications) 147. At least some of the kernel 141, the middleware 143, and the API 145 may be referred to as an operating system (OS).

The kernel 141 controls or manages system resources, such as the bus 110, the processor 120, or the memory 130 used for performing an operation or function implemented by the other programs, such as the middleware 143, the API 145, or the applications 147. Furthermore, the kernel 141 provides an interface through which the middleware 143, the API 145, or the applications 147 connects the individual elements of the electronic device 101 to control or manage the system resources.

The middleware 143 functions as an intermediary for allowing the API 145 or the applications 147 to communicate with the kernel 141 to exchange data.

In addition, the middleware 143 processes one or more task requests received from the applications 147 according to priorities thereof. For example, the middleware 143 assigns priorities for using the system resources of the electronic device 101, to at least one of the applications 147. For example, the middleware 143 may perform scheduling or load balancing on the one or more task requests by processing the one or more task requests according to the priorities assigned thereto.

The API 145 is an interface through which the applications 147 control functions provided from the kernel 141 or the middleware 143, and may include at least one interface or function, such as an instruction for file control, window control, image processing, or text control.

The input/output interface 150 functions as an interface that transfers instructions or data input from a user or another external device to the other element(s) of the electronic device 101. Furthermore, the input/output interface 150 outputs the instructions or data received from the other element(s) of the electronic device 101 to the user or an external electronic device.

The display 160 may include a liquid crystal display (LCD), a light emitting diode (LED) display, an organic LED (OLED) display, a micro electro mechanical system (MEMS) display, an electronic paper display, etc. The display 160 displays various types of content, such as text, images, videos, icons, or symbols for the user. The display 160 may include a touch screen and receive, for example, a touch, a gesture, proximity, a hovering input, etc., using an electronic pen or the user's body part. The display 160 may display a web page.

The communication interface 170 can establish a communication between the electronic device 101 and an external electronic device, such as a first external electronic device 102, a second external electronic device 104, or a server 106. For example, the communication interface 170 can communicate with the first external electronic device 102, the second external electronic device 104, or the server 106 in connection to the network 162 through wireless communication or wired communication or via a short-range communication 164. For example, the wireless communication can conform to a cellular communication protocol including at least one of LTE, LTE-advanced (LTE-A), code division multiple access (CDMA), wideband CDMA (WCDMA), universal mobile telecommunication system (UMTS), wireless broadband (WiBro), and global system for mobile communications (GSM).

The wired communication can include at least one of universal serial bus (USB), high definition multimedia interface (HDMI), recommended standard 232 (RS-232), and plain old telephone service (POTS).

The network 162 can include at least one of telecommunications networks, for example, a computer network such as local area network (LAN) or wide area network (WAN), the Internet, and a telephone network.

The electronic device 101 provides the LTE service in the single radio environment by use of at least one module functionally or physically separated from the processor 120.

Each of the first and second external electronic devices 102 and 104 may be a type of device that is the same as or different from the electronic device 101. According to an embodiment of the present disclosure, the server 106 may include a group of one or more servers. All or some of the operations to be executed by the electronic device 101 may be executed by another electronic device or a plurality of other electronic devices, such as the electronic devices 102 and 104 or the server 106. In the case where the electronic device 101 may perform a certain function or service automatically or by request, the electronic device 101 may request some functions that are associated therewith from the other electronic devices instead of or in addition to executing the function or service by itself. The electronic devices 102 and 104 or the server 106 may execute the requested functions or additional functions, and may transmit the results to the electronic device 101. The electronic device 101 may provide the requested functions or services by processing the received results. For this purpose, for example, a cloud computing technique, a distributed computing technique, or a client-server computing technique may be used.

Figure 2:
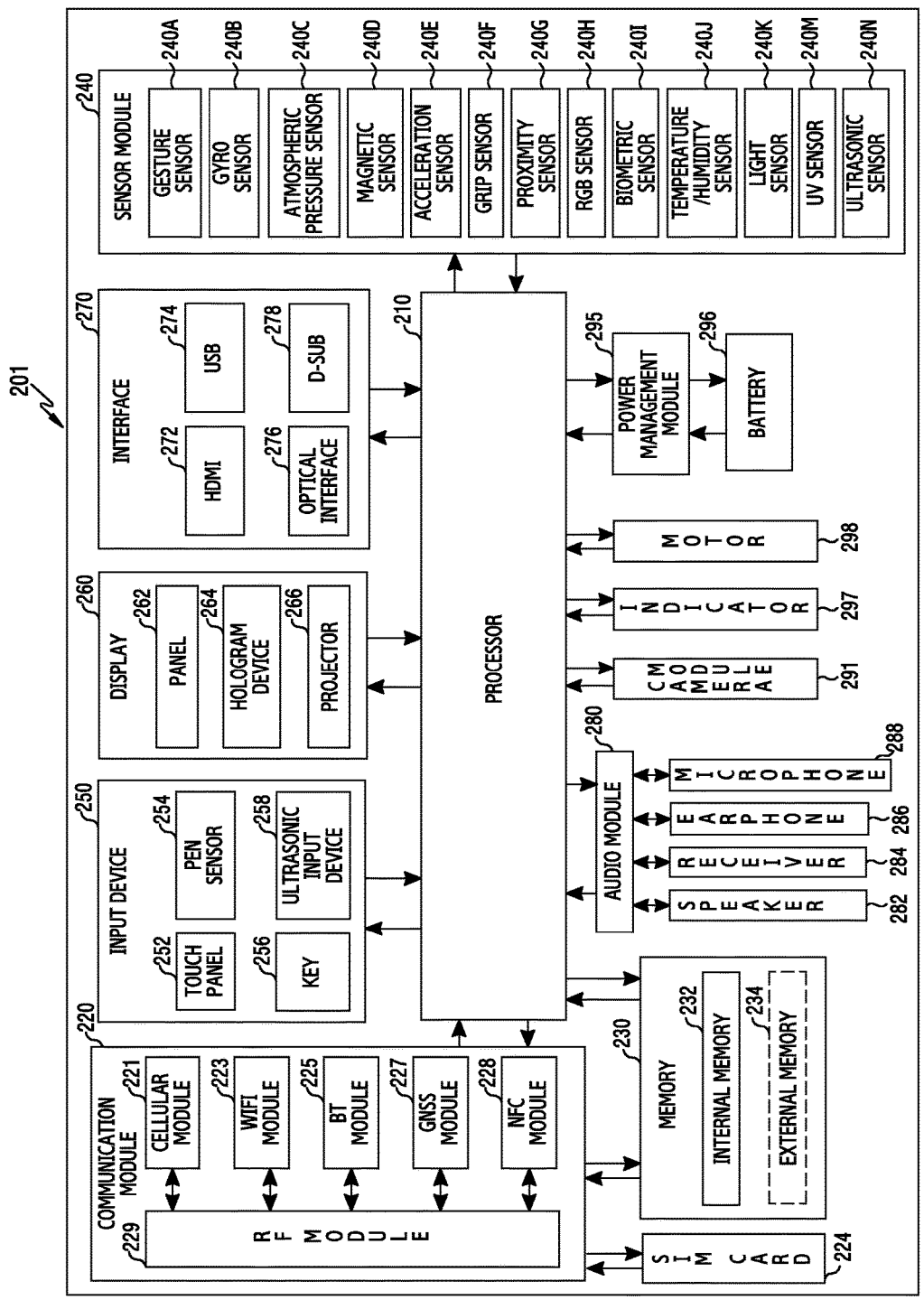
FIG. 2 is a block diagram of an electronic device according to embodiments of the present disclosure.

FIG. 2 illustrates a diagram of a configuration of an electronic device according to an embodiment of the present disclosure.

Referring to FIG. 2, the electronic device 201 may include all or some of the components described with reference to the electronic device 101 of FIG. 1. The electronic device 201 includes at least one processor (AP) 210, a communication module 220, a subscriber identification module (SIM) card 224, a memory 230, a sensor module 240, an input device 250, a display 260, an interface 270, an audio module 280, a camera module 291, a power management module 295, a battery 296, an indicator 297, and a motor 298.

The AP 210 controls a plurality of hardware or software elements connected to the AP 210 by driving an OS or an application program. The AP 210 processes a variety of data, including multimedia data, performs arithmetic operations, may be implemented with a system on chip (SoC) and may further include a graphical processing unit (GPU).

The communication module 220 performs data transmission/reception in communication between the external electronic device 104 or the server 106 which may be connected with the electronic device 201 through the network 162. The communication module 220 includes a cellular module 221, a Wi-Fi module 223, a Bluetooth® (BT) module 225, a global navigation satellite system (GNSS) or GPS module 227, a near field communication (NFC) module 228, and a radio frequency (RF) module 229.

The cellular module 221 provides a voice call, a video call, a text service, or an Internet service, such as through a communication network including LTE, LTE-A, CDMA, WCDMA, UMTS, WiBro, and GSM, for example. In addition, the cellular module 221 identifies and authenticates the electronic device 201 within the communication network by using the SIM card 224. The cellular module 221 may perform at least some of functions that can be provided by the AP 210. For example, the cellular module 221 may perform at least some of multimedia control functions.

The cellular module 221 includes a CP. Further, the cellular module 221 may be implemented, for example, with an SoC. Although elements, such as the cellular module 221, the memory 230, and the power management module 295 are illustrated as separate elements with respect to the AP 210 in FIG. 2, the AP 210 may also be implemented such that at least one part, such as the cellular module 221 of the aforementioned elements is included in the AP 210.

The AP 210 or the cellular module 221 loads an instruction or data, which is received from each non-volatile memory connected thereto or at least one of different elements, to a volatile memory and processes the instruction or data. In addition, the AP 210 or the cellular module 221 stores data, which is received from at least one of different elements or generated by at least one of different elements, into the non-volatile memory.

Each of the Wi-Fi module 223, the BT module 225, the GNSS module 227, and the NFC module 228 includes a processor for processing data transmitted/received through a corresponding module. Although the cellular module 221, the Wi-Fi module 223, the BT module 225, the GNSS module 227, and the NFC module 228 are illustrated in FIG. 2 as separate blocks, at least two of the cellular module 221, the Wi-Fi module 223, the BT module 225, the GNSS module 227, and the NFC module 228 may be included in one integrated chip (IC) or IC package. For example, at least some of processors corresponding to the cellular module 221, the Wi-Fi module 223, the BT module 225, the GNSS module 227, and the NFC module 228, such as a communication processor corresponding to the cellular module 221 and a Wi-Fi processor corresponding to the Wi-Fi module 223, may be implemented with an SoC.

The RF module 229 transmits/receives data, such as an RF signal, and may include a transceiver, a power amp module (PAM), a frequency filter, or a low noise amplifier (LNA), for example. In addition, the RF module 229 may further include a component for transmitting/receiving a radio wave on a free space in wireless communication, for example, a conductor, or a conducting wire. The cellular module 221, the Wi-Fi module 223, the BT module 225, the GNSS module 227, and the NFC module 228 may share one RF module 229, and at least one of these modules may transmit/receive an RF signal via a separate RF module.

The SIM card 224 may be inserted into a slot formed at a specific location of the electronic device 201. The SIM card 224 includes unique identification information, such as an integrated circuit card identifier (ICCID) or subscriber information, such as an international mobile subscriber identity (IMSI).

The memory 230 includes an internal memory 232 or an external memory 234.

The internal memory 232 may include at least one of a volatile memory, such as a dynamic random access memory (DRAM), a static RAM (SRAM), or a synchronous dynamic RAM (SDRAM) or a non-volatile memory, such as a one-time programmable read only memory (OTPROM), a programmable ROM (PROM), an erasable and programmable ROM (EPROM), an electrically erasable and programmable ROM (EEPROM), a mask ROM, a flash ROM, a not and (NAND) flash memory, and a not or (NOR) flash memory. The internal memory 232 may be a solid state drive (SSD).

The external memory 234 may include a flash drive, a compact flash (CF), secure digital (SD), micro-SD, mini-SD, extreme digital (xD), and a memory stick, and may be operatively coupled to the electronic device 201 via various interfaces.

The electronic device 201 may further include a storage unit (or a storage medium), such as a hard drive.

The sensor module 240 measures a physical quantity or detects an operation state of the electronic device 201, and converts the measured or detected information into an electric signal. The sensor module 240 includes, for example, at least one of a gesture sensor 240A, a gyro sensor 240B, a barometric pressure sensor or air sensor 240C, a magnetic sensor 240D, an acceleration sensor 240E, a grip sensor 240F, a proximity sensor 240G, a color sensor 240H, such as a red, green, blue (RGB) sensor, a biometric sensor 240I, a temperature/humidity sensor 240J, an illumination/illuminance sensor 240K and an ultraviolet (UV) sensor 240M.

Additionally or alternatively, the sensor module 240 may include, for example, an E-node sensor, an electromyography (EMG) sensor, an electroencephalogram (EEG) sensor, an electrocardiogram (ECG) sensor, and a fingerprint sensor.

The sensor module 240 may further include a control circuit for controlling at least one or more sensors included therein.

The input device 250 includes a touch panel 252, a (digital) pen sensor 254, a key 256, or an ultrasonic input unit 258.

The touch panel 252 recognizes a touch input by using at least one of an electrostatic type configuration, a pressure-sensitive type configuration, and an ultrasonic type configuration. The touch panel 252 may further include a control circuit. In the instance where the touch panel is of the electrostatic type, both physical contact recognition and proximity recognition are possible. The touch penal 252 may further include a tactile layer, which provides the user with a tactile reaction.

The (digital) pen sensor 254 may include a recognition sheet which is a part of the touch panel or is separated from the touch panel. The key 256 may include a physical button, an optical key, or a keypad. The ultrasonic input device 258 may detect ultrasonic waves generated by an input tool through a microphone 288, and may confirm data corresponding to the detected ultrasonic waves.

The (digital) pen sensor 254 may be implemented by using the same or similar method of receiving a touch input of the user or by using an additional sheet for recognition.

The key 256 may be a physical button, an optical key, a keypad, or a touch key.

The ultrasonic input unit 258 is a device by which the electronic device 201 detects a reflected sound wave through the microphone 288 and is capable of radio recognition. For example, an ultrasonic signal, which may be generated by using a pen, may be reflected off an object and detected by the microphone 288.

The electronic device 201 may use the communication module 220 to receive a user input from an external device, such as a computer or a server connected thereto.

The display 260 includes a panel 262, a hologram 264, or a projector 266.

The panel 262 may be a liquid crystal display (LCD) or an active-matrix organic light-emitting diode (AM-OLED), for example. The panel 262 may be implemented in a flexible, transparent, or wearable manner, and may be constructed as one module with the touch panel 252.

The hologram device 264 uses an interference of light and displays a stereoscopic image in the air.

The projector 266 displays an image by projecting a light beam onto a screen. The screen may be located inside or outside the electronic device 201.

The display 260 may further include a control circuit for controlling the panel 262, the hologram device 264, or the projector 266.

The interface 270 may include a high definition multimedia interface (HDMI) 272, a universal serial bus (USB) 274, an optical communication interface 276, or a D-subminiature (D-sub) 278. The interface 270 may be included, for example, in the communication interface 160 of FIG. 1, and may include a mobile high-definition link (MHL), SD/multimedia card (MMC) or infrared data association (IrDA).

The audio module 280 bilaterally converts a sound and an electric signal. At least some elements of the audio module 280 may be included in the input/output interface 150 of FIG. 1. The audio module 280 converts sound information which is input or output through a speaker 282, a receiver 284, an earphone 286, or the microphone 288 for example.

The speaker 282 may output a signal of an audible frequency band and a signal of an ultrasonic frequency band. Reflected waves of an ultrasonic signal emitted from the speaker 282 and a signal of an external audible frequency band may be received.

The camera module 291 is a device for image and video capturing, and may include one or more image sensors, such as a front sensor or a rear sensor, a lens, an image signal processor (ISP), or a flash, such as a light emitting diode (LED) or a xenon lamp. In certain instances, it may prove advantageous to include two or more camera modules.

The power management module 295 manages power of the electronic device 201. The power management module 295 may include a power management integrated circuit (PMIC), a charger IC, or a battery gauge.

The PMIC may be placed inside an IC or SoC semiconductor. Charging is classified into wired charging and wireless charging. The charger IC charges a battery, prevents an over-voltage or over-current flow from a charger, and includes a charger IC for at least one of the wired and the wireless charging.

The wireless charging may be classified, for example, into a magnetic resonance type, a magnetic induction type, and an electromagnetic type. An additional circuit for the wireless charging, such as a coil loop, a resonant circuit, or a rectifier may be added.

The battery gauge may measure a residual quantity of the battery 296 and a voltage, current, and temperature during charging. The battery 296 stores or generates electricity and supplies power to the electronic device 201 by using the stored or generated electricity. The battery 296 may include a rechargeable battery or a solar battery.

The indicator 297 indicates a specific state, such as a booting, a message, or a charging state of the electronic device 201 or a part thereof, such as the AP 210.

The motor 298 converts an electric signal into a mechanical vibration.

The electronic device 201 includes a processing unit, such as a GPU, for supporting mobile TV which processes media data according to a protocol of, for example, digital multi-media broadcasting (DMB), digital video broadcasting (DVB), or media flow.

Each of the aforementioned elements of the electronic device 201 may consist of one or more components, and names thereof may vary depending on a type of the electronic device 201. The electronic device 201 may include at least one of the aforementioned elements. Some of the elements may be omitted, or additional other elements may be further included. In addition, some of the elements of the electronic device 201 may be combined and constructed as one entity, so as to equally perform functions of corresponding elements before combination.

At least some parts of a device, such as modules or functions thereof, or operations, may be implemented with an instruction stored in a computer-readable storage media for example. The instruction may be executed by the processor 210, to perform a function corresponding to the instruction. The computer-readable storage media may be the memory 230. At least some parts of the programming module may be executed by the processor 210. At least some parts of the programming module may include modules, programs, routines, and a set of instructions for performing one or more functions.

Figure 3A:
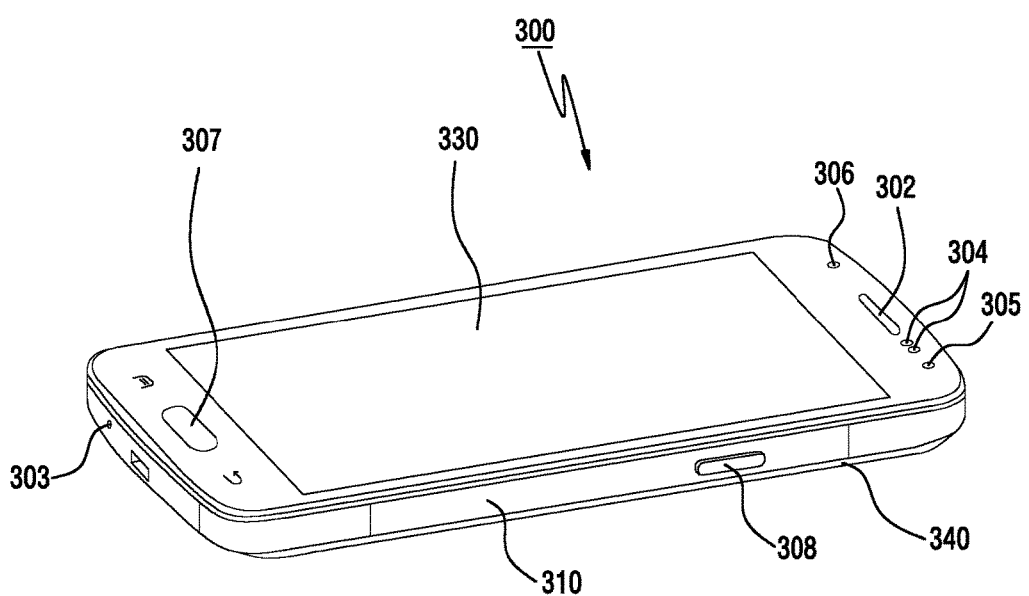
FIG. 3A is a perspective view illustrating an electronic device according to embodiments of the present disclosure.

FIG. 3A is a perspective view illustrating an electronic device 300 according to embodiments of the present disclosure.

Referring to FIG. 3A, a display 330 may be disposed on the front face of the electronic device 300. According to one embodiment, the display 330 may include a touch screen device that includes a touch sensor. A speaker device 302 may be disposed at one side of the display 330. A microphone device 303 may be disposed at the other side of the display 330 to transmit the voice of a user to a counterpart.

According to embodiments, components for conducting various functions of the electronic device 300 may be arranged around the speaker device 302. The components may include one or more sensor modules 304. The sensor modules 304 may include at least one of, for example, an illuminance or proximity sensor, such as an optical sensor, an infrared sensor, and an ultrasonic sensor. The components may include a front camera device 305, and an indicator 306 configured to allow a user to recognize status information of the electronic device. The electronic device 300 may be provided with one or more key buttons, which may be partially exposed to the outside. The key buttons may include a side key button 308 disposed on a side face of the electronic device 300. The key buttons may include a home key button 307 disposed in a region other than a display region in the front face of the electronic device 300.

According to embodiments, the electronic device 300 may include a housing 310, and the exterior of the electronic device may be configured in a manner in which the housing 310 is coupled with the display 330. The housing 310 may be formed of a synthetic resin material. A rear housing 340 may be disposed on the rear side of the electronic device 300, and may be integrally formed with the housing 310.

According to embodiments, the housing 310 may include a metallic member in at least a portion thereof. The metallic member may be arranged along the rim of the electronic device 300, and may be disposed to expand to at least a portion of the rear face of the electronic device 300 that extends from the rim. The metallic member may serve as the thickness of the electronic device 300 along the rim of the electronic device 300, and may be formed in a closed loop shape. The metallic member may be formed to serve as at least a portion of the thickness of the electronic device, and may be at least partially embedded in the inside of the electronic device 300.

According to embodiments, the electronic device 300 may include a plurality of electronic components therein, such as an antenna device, a battery pack, a printed circuit board (PCB), a flexible printed circuit board (FPCB), a wireless charging battery cover, a socket device, a shield can, various devices, a sensor module, a camera module, a speaker module, a microphone module, a key button assembly, an interface connector, and a lighting device. One or more of the above-mentioned electronic components may be mounted on a board that is disposed inside the electronic device.

According to embodiments, the board may be anchored to the housing 310 by a board anchoring device. The board may be anchored by a plurality of screws in an inner space formed by the housing 310. The screws may penetrate through the first face, such as the top side of the board in a manner of being fastened to screw fastening portions provided in the housing so as to anchor the board to the housing. In such a case, washer members of the present disclosure may be mounted on the board, and the screws may respectively pass through the washer members and may then be fastened to the housing. The washer members may be mounted the board through a surface mounting technology (SMT) process.

According to embodiments, as the washer members are applied to the board, fastening positions for screw fastening may be freely determined. The fastening positions may be disposed in a region of the board which overlaps with the display.

Figure 3B:
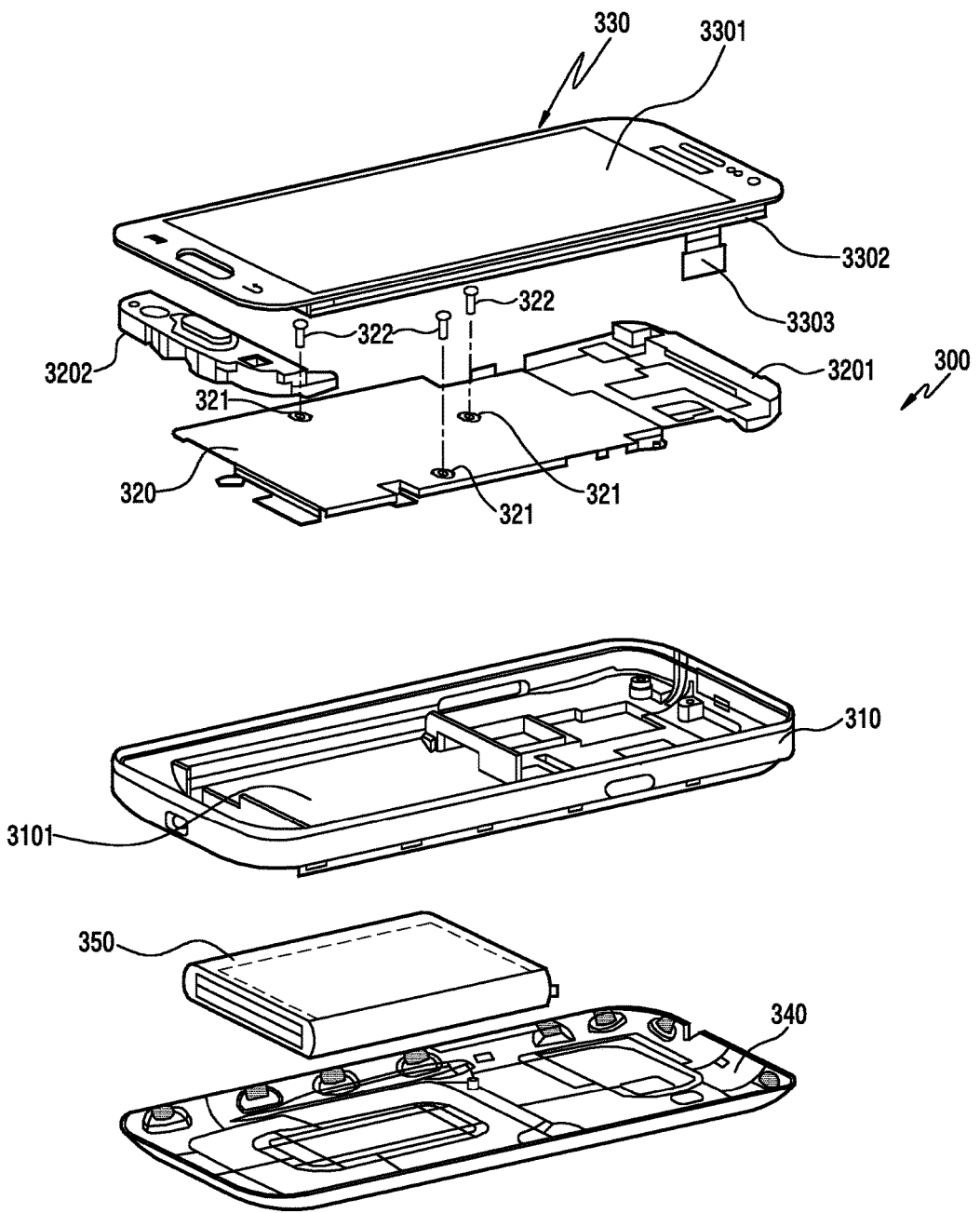
FIG. 3B is an exploded perspective view illustrating an electronic device according to embodiments of the present disclosure.

FIG. 3B is an exploded perspective view illustrating an electronic device 300 according to embodiments of the present disclosure.

Referring to FIG. 3B, the electronic device 300 may include a housing 310, and may further include a board 320 and a display 330, which may be sequentially disposed in a space formed in the housing 310. The display 330 may include a window 3301 and a display module 3302 disposed on the rear face of the window 3301, and may include a touch screen device that includes a touch sensor. An electric connection member 3303 is drawn out to one side of the display module 3302 to be electrically connected to the board 320 disposed below the display module 3302. The electric connection member 3303 may include an FPCB and a connector that is provided on an end of the FPCB.

According to one embodiment, the board 320 may be anchored in an inner space formed by the housing 310. One or more washer members 321 may be mounted on a desired region of the board 320 through an SMT process. The board 320 may be anchored to the housing 310 by screws 322 that have passed through the washer members 321 and the board 320. The washer members 321 are disposed in a region of the board 320, which overlaps with the display module 3302, and may receive the screws 322, respectively. With such an assembly structure, because the board 320 may be fastened to the housing 310 by the screws 322 in the desired region, the board 320 may be maintained as being rigidly anchored to the housing 310.

According to embodiments, a first sub-assembly 3201 may be at a side of the board 320, and a second sub-assembly 3202 may be disposed at the other side of the board 320. The first and second sub-assemblies 3201 and 3202 may be molded products of a synthetic resin material. The first and second sub-assemblies 3201 and 3202 may be structures of different materials in which one or more synthetic resin members and one or more metallic members are coupled to each other. The first sub-assembly 3201 and the second sub-assembly 3202 may be disposed in a region that corresponds to a black mask (BM) region of the display 330 so as to accommodate the above-mentioned various electronic components, such as a speaker device, a microphone device, various sensor modules, an indicator, and an interface connector port.

According to embodiments, a battery pack 350 may be mounted through a battery pack accommodation port 3101 of the housing 310, and a rear housing 340 may be removably mounted on the bottom side of the housing 310. The rear housing 340 may be integrally formed with the housing 310.

Figure 4:
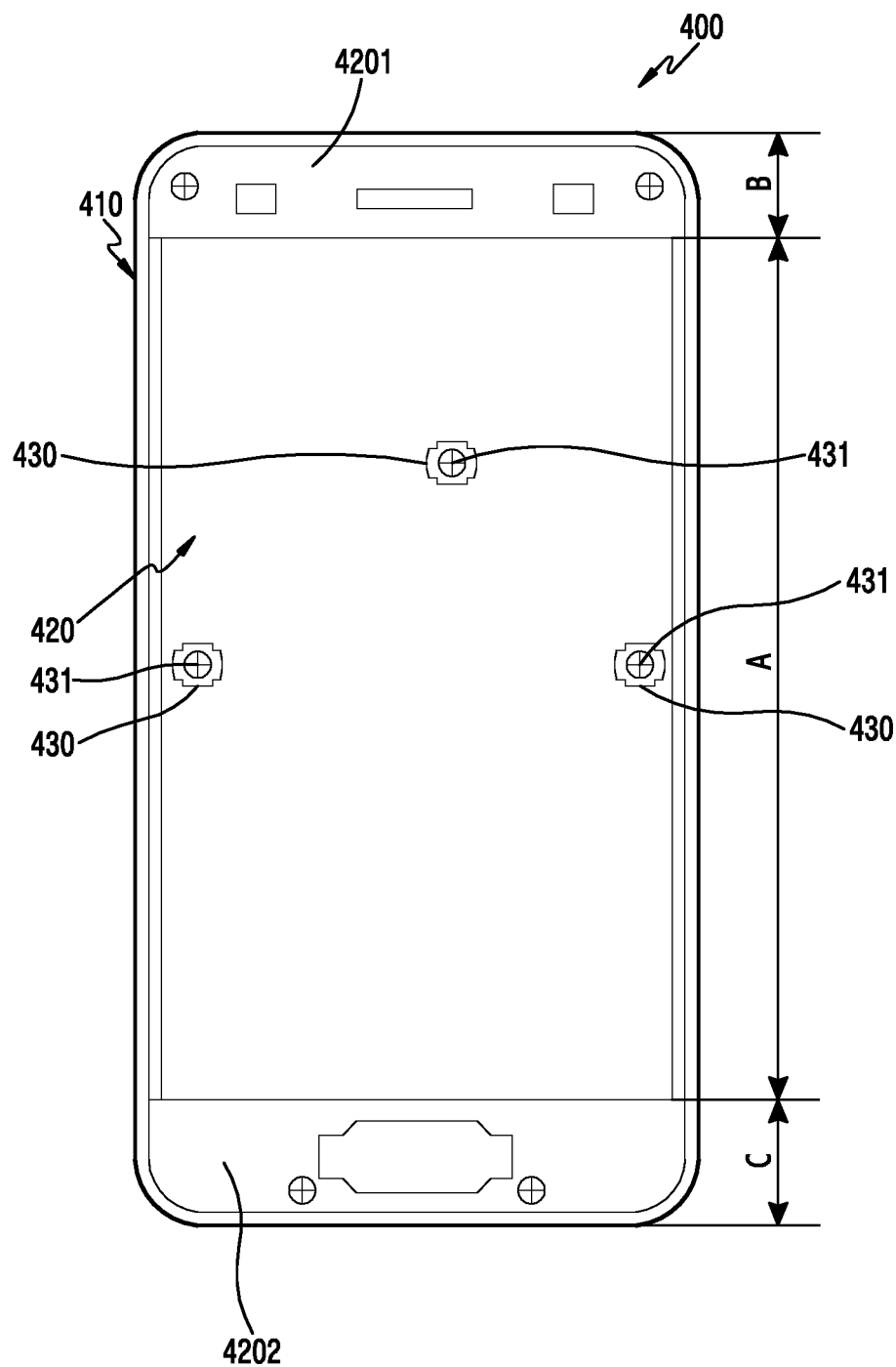
FIG. 4 illustrates when a board is anchored to a housing of an electronic device according to embodiments of the present disclosure.

FIG. 4 illustrates when a board 420 is anchored to a housing 410 of an electronic device 400 according to embodiments of the present disclosure.

The washer members 430 of FIG. 4 may be similar to, or different from, the washer members 321 of FIG. 3B.

Referring to FIG. 4, the board 420, which includes a first sub-assembly 4201 and a second sub-assembly 4202, may be mounted on the housing 410. According to one embodiment, the board 420 may be disposed such that it overlaps with a display module arrangement region (region A) and BM regions (regions B and C) when viewed from the outside of the electronic device 400, and the washer members 430 may be disposed in the display module arrangement region (region A).

According to one embodiment, the washer members 430 may be mounted on the board 420 through an SMT process, and may be formed of a metallic material. The washer members 430 may be mounted to be electrically connected to a conductive ground region of the board 420. Accordingly, when screws 431 are fastened through the board 420 and a shield can mounted on the rear face of the board 420, the shield can may be electrically connected to a conductive ground region of the board 420. The washer member 430 may be formed of a metallic material, such as stainless steel, copper, or aluminum, and may guide the screws to rigidly anchor the housing 410 and the board 420 to each other while preventing the board 420 from being cracked, flexed, or damaged by a fastening force when the screws 431 are fastened. Since each washer member 430 may accommodate the head of each screw 431, the spacing distance, which may be formed between the display and the board by the heads of the screws 431 may be minimized.

Figure 5A:
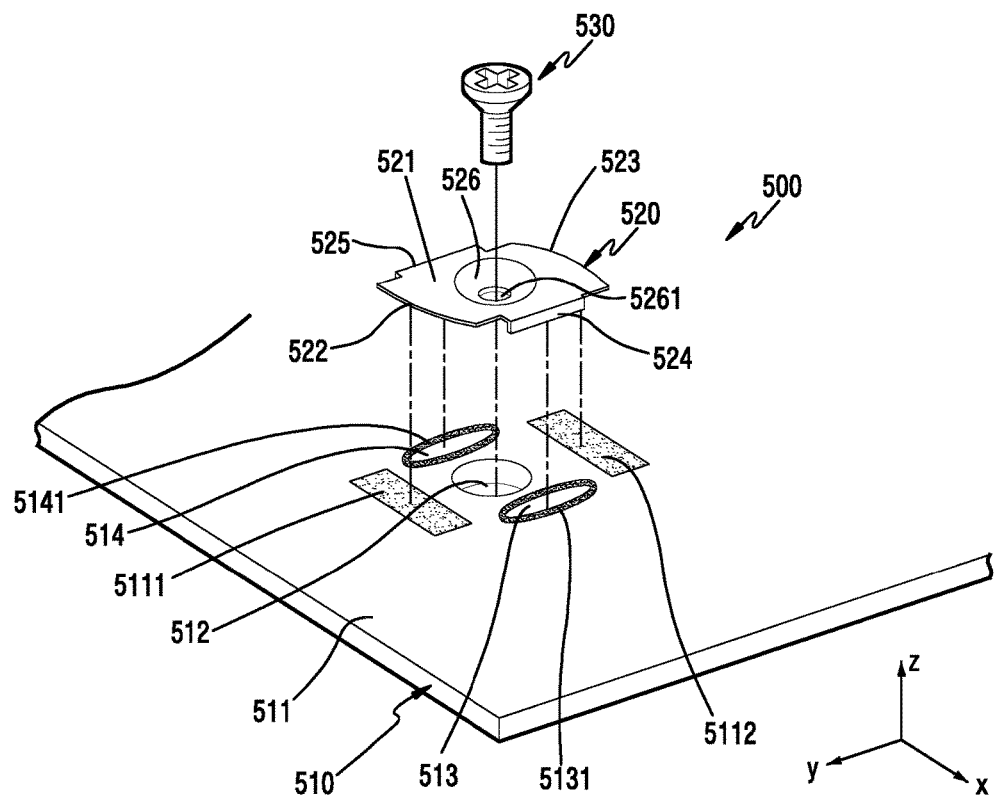
FIG. 5A is an exploded perspective view illustrating a board anchoring device according to embodiments of the present disclosure.
Figure 5B:
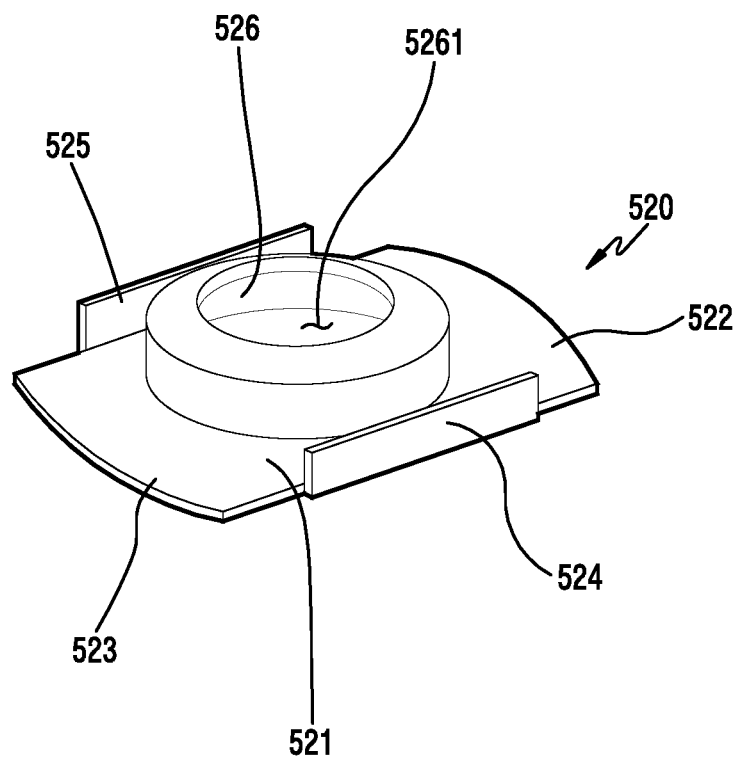
FIG. 5B is a perspective view illustrating a washer member according to embodiments of the present disclosure.

FIG. 5A is an exploded perspective view illustrating a board anchoring device 500 according to embodiments of the present disclosure. FIG. 5B is a perspective view illustrating a washer member 520 according to embodiments of the present disclosure.

The washer member 520 of FIGS. 5A and 5B may be similar to, or different from, the washer members of FIGS. 3B and 4.

Referring to FIGS. 5A and 5B, the board anchoring device 500 may include a board 510, a washer member 520 mounted on the board 510, and a screw 530 that passes through the washer member 520 and the board 510 to be fastened to a housing. The board anchoring device may include a rivet that is riveted to the housing through the washer member 520 and the board 510.

According to embodiments, the washer member 520 may be formed of a metallic material, such as SUS, copper, or aluminum. According to one embodiment, the washer member 520 may be formed by using a machining method, such as pressing or punching. The washer member 520 may include a rectangular plate portion 521 having a predetermined area, a pair of legs 524 and 525 bent downward to face each other in a horizontal direction (x-axis direction) of the plate portion 521, and a pair of extension pieces 522 and 523 extending parallel to the plate portion 521 to face each other in a vertical direction (y-axis direction) of the plate portion 521.

The pair of legs 524 and 525 and the pair of extension pieces 522 and 523 may be integrally formed with the plate portion 521. According to one embodiment, first and second legs 524 and 525 and first and second extension pieces 522 and 523 may be alternately formed. The legs 524 and 525 and the extension pieces 522 and 523 may be formed to neighbor each other. The numbers of the legs and extension pieces may vary depending on various shapes of the plate portion.

According to embodiments, the plate portion 521 may be formed with a screw accommodation groove 526, which is recessed by a predetermined depth in the downward direction (in the z-axis direction), and a screw through-hole 5261 may be formed at the center of the screw accommodation groove 526. A screw 530 may pass through the screw through-hole 5261, and upon being fastened, the head of the screw 530 may be accommodated in the screw accommodation groove 526.

According to one embodiment, the washer members 520 may be mounted on a first face, such as the top face 511 of the board 510, and may be mounted such that at least a portion of the washer member 520 is soldered to conductive exposure portions 5131, 5141, 5111, and 5112, through a surface mount technology (SMT) process, in which a solder resist (SR) layer of the board 510 is removed in the conductive exposure portions 5131, 5141, 5111, and 5112.

According to one embodiment, in the board 510, an opening 512 may be formed so as to accommodate the screw accommodation groove 526 protruding downward from the plate portion 521 of the washer member 520, and to accommodate a screw 530 passing through the screw through-hole 5261 formed in the screw accommodation groove 526. A pair of leg accommodation ports 513 and 514 may be formed around the opening 512, and may include a first leg accommodation port 513 configured to accommodate a first leg 524 of the washer member 520 and a second leg accommodation port 514 configured to accommodate a second leg 525 of the washer member 520. A first conductive exposure portion 5131 may be formed where the SR layer is removed along the periphery, such as along the rim of the first leg accommodation port 513. A second conductive exposure portion 5141 may be formed where the SR layer is removed along the periphery, such as along the rim) of the second leg accommodation port 514. Accordingly, when the first leg 524 of the washer member 520 is inserted into the first leg accommodation port 513 and then soldered through the first conductive exposure portion 5131, the first leg 524 may be electrically connected to the first conductive exposure portion 5131. When the second leg 525 of the washer member 520 is inserted into the second leg accommodation port 514 and then soldered through the second conductive exposure portion 5141, the second leg 525 may be electrically connected to the second conductive exposure portion 5141.

According to one embodiment, on the first face 511 of the board 510, a pair of conductive exposure portions 5111 and 5112 may be further formed where the SR layer is removed. A third conductive exposure portion 5111 may be formed on the first face 511 of the board 510 to correspond to the first extension piece 522 of the washer member 520. A fourth conductive exposure portion 5112 may be formed on the first face 511 of the board 510 to correspond to the second extension piece 523 of the washer member 520. When the washer member 520 is mounted on the first face 511 of the board 510, the first and second legs 524 and 525 of the washer member 520 are inserted into the first and second leg accommodation ports 513 and 514 of the board 520 and soldered, and the first and second extension pieces 522 and 523 of the washer member 520 may come in plane contact with the third and fourth exposure portions 5111 and 5112 of the board 520 and then may be fixed by soldering. Consequently, the washer member 520 may be electrically connected to the board 520. The first to fourth exposure portions 5131, 5141, 5111, and 5112 may include a conductive ground region of the board 520. Accordingly, when the washer member 520 is mounted on the board 510, the washer member 520 may be maintained as being electrically connected to the conductive ground region of the board 510.

According to embodiments, when the board 510 is anchored to the housing including a metallic member through the screw 530 that is fastened through the washer member 520, the housing including the metallic member may be electrically connected to a conductive ground region of the board 510 through the screw 530 and the washer member 520. When a shield can made of a metallic material is anchored to the board 510 through the screw 530 that is fastened through the washer member 520, the shield can may be electrically connected to a conductive ground region of the board 510 through the screw 530 and the washer member 520.

Figure 5C:
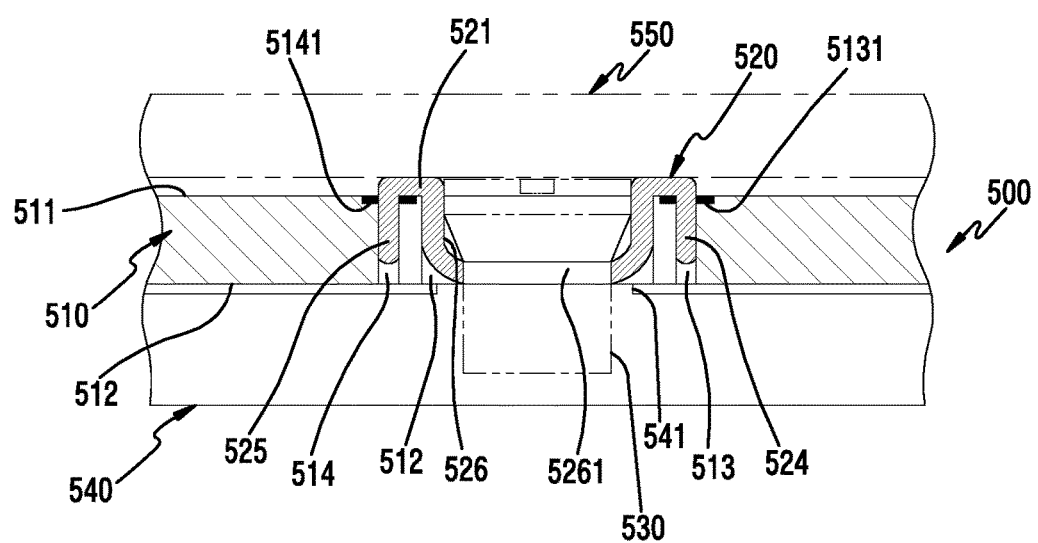
FIG. 5C is a sectional view of a main portion illustrating when a board is mounted on a housing by a board anchoring device according to embodiments of the present disclosure.

FIG. 5C is a sectional view of a main portion, illustrating when the board 510 is mounted on the housing 540 by the board anchoring device 500 according to embodiments of the present disclosure.

Referring to FIG. 5C, the board anchoring device 500 may include the board 510 disposed in the inner space of the housing 540, the washer member 520 mounted on the first face 511 of the board 510, and a screw 530 fixed to a screw fastening portion 541 of the housing 540 through the washer member 520 and the board 510.

According to embodiments, the washer members 520 may be mounted on the first face 511 of the board 510. When the washer member 520 is mounted on the first face 511 of the board 510, the first and second legs 524 and 525 of the washer member 520 may be inserted into the first and second leg accommodation ports 513 and 514 of the board 510, respectively, and may be soldered to the first and second conductive exposure portions 5131 and 5141. As illustrated in FIG. 5A, the first and second extension pieces 522 and 523 of the washer member 520 may come in plane contact with the third and fourth conductive exposure portions 5111 and 5112 of the board 510 and may be anchored the third and fourth conductive exposure portions 5111 and 5112 by soldering, thereby being electrically connected. The first to fourth exposure portions 5131, 5141, 5111, and 5112 may include a portion of the conductive ground region of the board 510. Accordingly, when the washer member 520 is mounted on the board 510, the washer member 520 may be maintained as being electrically connected to the conductive ground region of the board 510.

According to embodiments, the housing 540 may be disposed to directly face the second face 512 of the board 510, which is opposite to the first face 511 of the board 510. The board 510 may be anchored to the housing 540 by fastening the screw 530 to the screw fastening portion 541 of the housing 540 through the screw through-hole 5261 formed in the screw accommodation groove 526 of the washer member 520 mounted on the first face 511 of the board 510 and the opening 512 of the board 510. The screw head of the screw 530 may be seated within the screw accommodation groove 526 of the washer member 520. When completely fastened, the screw head may be disposed to be relatively lower than the top face of the plate portion 521 of the washer member 520.

According to embodiments, a display 550 may be disposed to directly face the first face 511 of the board 510, which is opposite to the second face 512 of the board 510. Even if the display 550 is disposed, the restriction in installing the display 550 by the head of the screw 530 may be excluded and the damage of the display 550 by the interference of the screw head may be prevented because the screw head of the screw 530 is seated in the screw accommodation groove 526 formed in the plate portion 521 of the washer member 520.

Figure 6:
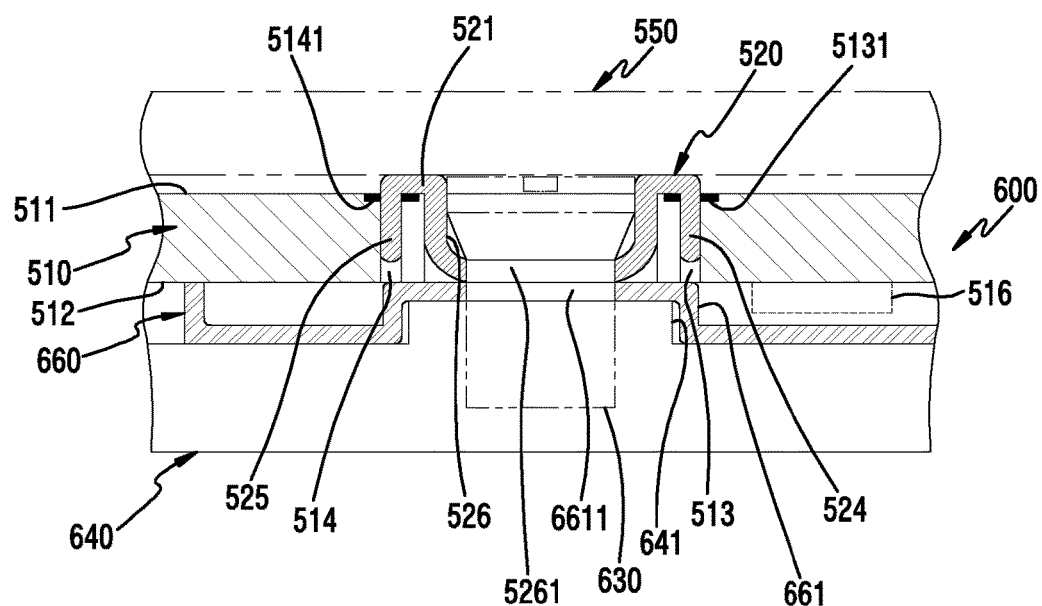
FIG. 6 is a sectional view of a main portion illustrating when a board is mounted on a housing by a board anchoring device according to embodiments of the present disclosure.

FIG. 6 is a sectional view of a main portion, illustrating when a board is mounted on a housing by a board anchoring device according to embodiments of the present disclosure.

The board anchoring device 600 of FIG. 6 may be similar to, or different from, the board anchoring device 500 of FIG. 5C. According to one embodiment, it is noted that the constituent elements described in FIG. 6 that are similar to those of FIG. 5C are denoted by the same reference numerals.

Referring to FIG. 6, the board anchoring device 600 may include a board 510 disposed in the inner space of the housing 640, a washer member 520 mounted on the first face 511 of the board 510, and a screw 630 fixed to a screw fastening portion 641 of the housing 640 through the washer member 520 and the board 510.

According to embodiments, the washer members 520 may be mounted on the first face 511 of the board 510. When the washer member 520 is mounted on the first face 511 of the board 510, the first and second legs 524 and 525 of the washer member 520 may be inserted into the first and second leg accommodation ports 513 and 514 of the board 510, respectively, and may be soldered to the first and second conductive exposure portions 5131 and 5141.

As illustrated in FIG. 5A, the first and second extension pieces 522 and 523 of the washer member 520 may come in plane contact with the third and fourth conductive exposure portions 5111 and 5112 of the board 510 and may be anchored the third and fourth conductive exposure portions 5111 and 5112 by soldering, thereby being electrically connected. According to one embodiment, the first to fourth exposure portions 5131, 5141, 5111, and 5112 may include a portion of the conductive ground region of the board 510. Accordingly, when the washer member 520 is mounted on the board 510, the washer member 520 may be maintained as being electrically connected to the conductive ground region of the board 510.

According to embodiments, a shield can 660 may be disposed on the second face 512 of the board 510, which is opposite to the first face 511 of the board 510. The shield can 660 may perform a function of shielding harmful radio waves, such as electromagnetic waves generated from an electronic component 516 mounted on the second face 512 of the board 510. The shield can 660 and the board 510 may define a space therebetween so as to accommodate the electronic component 516. The shield can 660 may include a board contact portion 661 to come in contact with the second face 512 of the board 510 in a portion that corresponds to the opening 512 of the board 510. The board contact portion 661 is formed with a through-hole 6611 so as to accommodate a screw 630 that penetrates the board 510 through the washer member 520.

According to embodiments, the housing 640 may be disposed to correspond to the rear face of the shield can 660 in the direction of directly facing the second face 512 of the board 510. The board 510 may be anchored to the housing 640 by fastening the screw 630 to the screw fastening portion 641 of the housing 640 through the screw through-hole 5261 formed in the screw accommodation groove 526 of the washer member 520 mounted on the first face 511 of the board 510, the opening 512 of the board 510, and the through-hole 6611 formed in the board contact portion 661 of the shield can 660. The screw head of the screw 630 may be seated within the screw accommodation groove 526 of the washer member 520. Upon being completely fastened, the screw head may be disposed to be relatively lower than the top face of the plate portion 521 of the washer member 520.

According to embodiments, a display 550 may be disposed to directly face the first face 511 of the board 510, which is opposite to the second face 512 of the board 510. Even if the display 550 is disposed, the restriction in installing the display 550 by the head of the screw 630 may be excluded and damage of the display 550 by the interference of the screw head may be prevented because the screw head of the screw 530 is seated in the screw accommodation groove 526 formed in the plate portion 521 of the washer member 520.

According to embodiments, when the shield can 660 made of a metallic material is anchored to the board 510 through the screw 630 that is fastened through the washer member 520, the shield can 660 may be electrically connected to a conductive ground region of the board 510 through the screw 630 and the washer member 520.

According to embodiments of the present disclosure, because screw fastening is enabled in a desired region where the board is to be supported, it is possible to prevent the board from being cracked and delaminated from the housing, which may be caused by an external impact. Consequently, the reliability of the electronic device can be enhanced.

The embodiments of the present disclosure disclosed in the specification and the drawings are only particular examples disclosed in order to easily describe the technical matters of the present disclosure and help with comprehension of the present disclosure, and do not limit the scope of the present disclosure. Therefore, in addition to the embodiments disclosed herein, the scope of the embodiments of the present disclosure should be construed to include all modifications or modified forms drawn based on the technical idea of the embodiments of the present disclosure.

While the present disclosure has been shown and described with reference to certain embodiments thereof, it will be apparent to those skilled in the art that the present disclosure is not limited to these embodiments, and various changes in form and details may be made therein without departing from the spirit and scope of the present disclosure as defined by the appended claims.

What is claimed is:

1. An electronic device comprising:
a housing including an inner space;
a board including a first face, and a second face which is opposite to the first face, the board being disposed such that the second face directly faces the inner space of the housing;
at least one washer member mounted on the first face of the board, at least a portion of the washer member being soldered to a conductive exposure portion that is exposed to the first face of the board;
a fastening member that anchors the board to the housing through the washer member and the first and second faces of the board; and
at least one electronic component disposed in the housing to directly face the first face of the board,
wherein the washer member includes:
a plate portion that comes in plane contact with the first face of the board,
a fastening member through-hole formed in the plate portion,
at least one extension piece formed to extend from at least one end of the plate portion, and
at least one leg bent toward the board in at least one end of the plate portion and then inserted into a leg accommodation port of the board, and
wherein the at least one extension piece and the at least one leg are soldered to the conductive exposure portion where a solder resist layer is removed at a corresponding position in the first face of the board through a surface mounting technology process.

2. The electronic device of claim 1, wherein the conductive exposure portion is formed along a rim of the leg accommodation port of the board, and is soldered with the leg inserted into the leg accommodation port.

3. The electronic device of claim 1, wherein the conductive exposure portion is formed at a position corresponding to the at least one extension piece in the first face of the board, and is soldered with the at least one extension piece which is in plane contact with the conductive exposure portion.

4. The electronic device of claim 1, wherein the plate portion, the at least one extension piece, and the at least one leg are integrally formed.

5. The electronic device of claim 1, wherein the conductive exposure portion includes at least a portion of a conductive ground region of the board.

6. The electronic device of claim 1, wherein the plate portion includes a seating groove that is formed to protrude toward the board and is inserted into an opening formed in the board, and the fastening member through-hole is formed in the center of the seating groove.

7. The electronic device of claim 6, wherein, when the fastening member is anchored to the housing through the washer member and the board, the fastening member is seated in the seating groove, and is disposed to be lower in height than the plate portion.

8. The electronic device of claim 1, wherein the washer member is formed of at least one of stainless steel, copper, and aluminum.

9. The electronic device of claim 1, wherein the fastening member includes a screw or a rivet.

10. The electronic device of claim 1, further comprising:
a shield can disposed between the housing and the second face of the board, to the shield can thereby blocking radio waves of the electronic component mounted on the board, wherein the shield can is disposed on the second face of the board by the fastening member.

11. The electronic device of claim 10, wherein the shield can is electrically connected with a ground region of the board through the fastening member.

12. The electronic device of claim 1, wherein the at least one washer member is disposed in a region of the board which directly faces the region where the at least one electronic component is disposed.

13. The electronic device of claim 1, wherein the at least one electronic component includes a display coupled to the housing, and
wherein the washer member is disposed in a region of the board which directly faces a region where a display module of the display is disposed.

14. The electronic device of claim 1, wherein the at least one electronic component includes one or more of an antenna device, a battery pack, a board, a wireless charging battery cover, a socket device, a shield can, various devices, a sensor module, a camera module, a speaker module, a microphone module, a key button assembly, an interface connector, and a lighting device.

15. An electronic device comprising:
a housing including an inner space;
a board including a first face, and a second face which is opposite to the first face, the board being disposed such that the second face directly faces the inner space of the housing;
a conductive shield can mounted on the second face of the board and blocking radio waves;
at least one washer member mounted on the first face of the board, at least a portion of the washer member being soldered to a conductive exposure portion that is exposed to the first face of the board;
a fastening member that anchors the board to the housing through the conductive washer member, the board, and the conductive shield can; and
a display disposed in the housing to directly face the first face of the board,
wherein the washer member includes:
a plate portion that comes in plane contact with the first face of the board;
a fastening member through-hole formed in the plate portion;
at least one extension piece formed to extend from at least one end of the plate portion; and
at least one leg bent toward the board in at least one end of the plate portion and then inserted into a leg accommodation port of the board, and
wherein the at least one extension piece and the at least one leg is soldered to the conductive exposure portion where a solder resist layer is removed at a corresponding position in the first face of the board through a surface mounting technology process.

16. The electronic device of claim 15, wherein the conductive exposure portion includes at least a portion of a conductive ground region of the board.

17. The electronic device of claim 16, wherein the shield can is electrically connected with the conductive ground region of the board by use of an electric path through the conductive exposure portion, the washer member, and the fastening member.

18. The electronic device of claim 15, wherein the fastening member is a screw or a rivet.

* * * * *